US012696692B2

(12) United States Patent
Chen et al.

(10) Patent No.: US 12,696,692 B2
(45) Date of Patent: Jul. 28, 2026

(54) CRYSTALLINE WAFERS AND PROCESS FOR FORMING CRYSTALLINE WAFERS

(71) Applicant: II-VI Advanced Materials, LLC, Pine Brook, NJ (US)

(72) Inventors: Y.K. Chen, Wilmington, DE (US); Charles D. Tanner, Wilmington, DE (US); Jeremy Turcaud, Wilmington, DE (US)

(73) Assignee: II-VI Advanced Materials LLC, Pine Brook, NJ (US)

( * ) Notice: Subject to any disclaimer, the term of this patent is extended or adjusted under 35 U.S.C. 154(b) by 219 days.

(21) Appl. No.: 18/433,031

(22) Filed: Feb. 5, 2024

(65) Prior Publication Data

US 2025/0140556 A1 May 1, 2025

Related U.S. Application Data

(60) Provisional application No. 63/594,544, filed on Oct. 31, 2023.

(51) Int. Cl.
*C30B 25/20* (2006.01)
*C30B 25/10* (2006.01)
(Continued)

(52) U.S. Cl.
CPC ............ *H10P 14/24* (2026.01); *C30B 25/105* (2013.01); *C30B 25/20* (2013.01); *C30B 29/04* (2013.01); *H10P 95/90* (2026.01)

(58) Field of Classification Search
CPC .......... H01P 14/24; H01P 95/90; C30B 25/20; C30B 25/105; C23C 16/27; C23C 16/279
See application file for complete search history.

(56) References Cited

U.S. PATENT DOCUMENTS

| | | | |
|---|---|---|---|
| 5,334,283 A | 8/1994 | Parikh et al. | |
| 7,943,485 B2 * | 5/2011 | Francis | ............. H01L 21/76254 |
| | | | 438/455 |

(Continued)

FOREIGN PATENT DOCUMENTS

| | | | |
|---|---|---|---|
| CN | 107400871 A | * 11/2017 | .......... C23C 16/274 |
| JP | 200831503 | 2/2008 | |

(Continued)

OTHER PUBLICATIONS

Korean Office Action in Application No. KR10-2024-0091784, dated Jul. 18, 2025, 18 pages with English translation.

(Continued)

*Primary Examiner* — Robert M Kunemund
(74) *Attorney, Agent, or Firm* — McAndrews, Held & Mallloy, Ltd.

(57) ABSTRACT

Methods of forming a crystalline wafers or films such as a diamond wafer or film are disclosed. Such a method may include creating a damaged layer in a seed wafer at a depth from a seed wafer upper surface. The seed wafer may include a diamond crystalline structure. The method may also include growing a diamond epitaxial layer on the seed wafer upper surface via a chemical vapor deposition (CVD) process. A growth temperature of the CVD process may convert the damaged layer into a graphitized interface between the seed wafer and the diamond epitaxial layer. The method may further include applying light from a laser to the graphitized interface to separate the diamond epitaxial layer from the seed wafer and obtain the diamond wafer.

19 Claims, 5 Drawing Sheets

(51) Int. Cl.

| | | |
|---|---|---|
| *C30B 29/04* | (2006.01) | |
| *H10P 14/24* | (2026.01) | |
| *H10P 95/90* | (2026.01) | |

(56) References Cited

U.S. PATENT DOCUMENTS

| | | | |
|---|---|---|---|
| 8,388,752 B2 | 3/2013 | Kamei et al. | |
| 2007/0221119 A1 | 9/2007 | Kimoto et al. | |
| 2010/0190324 A1* | 7/2010 | Hilkene ............. | H01L 21/2236 |
| | | | 438/513 |
| 2017/0233889 A1 | 8/2017 | Nishibayashi et al. | |

FOREIGN PATENT DOCUMENTS

| | | |
|---|---|---|
| JP | 201013322 | 1/2010 |
| JP | 2010272879 | 12/2010 |
| JP | 201251793 | 3/2012 |
| JP | 201284703 | 4/2012 |
| WO | 2008013108 | 1/2008 |
| WO | 2016021710 | 5/2017 |

OTHER PUBLICATIONS

Japanese Office Action in Application No. 2024-087912, dated Jul. 23, 2025, 6 pages with English translation.

Extended European Search Report for Application No. 24196250.5 dated Jan. 27, 2025, 8 pages.

"Single-Crystal Diamond Plate Liftoff Achieved by Ion Implantation and Subsequent Annealing", N.R. Parikh, et al. Applied Physics Letters 61, 3124-3126 (1992), 4 pages.

"Low Energy Ion Implantation and Electrochemical Separation of Diamond Films", Mike Marchywka, et al., Applied Physics Letters 63, 3521-3523 (1993), 4 pages.

"Synthesis of Large Single Crystal Diamond Plates by High Rate Homoepitaxial Growth Using Microwave Plasma CVD and Lift-Off Process", Y. Mokuno, et al., Science Direct, 2008, 415-418, 4 pages.

"Bridgman-Stockbarger method", https://en.wikipedia.org./wiki/Bridgman-Stockbarger_method, retrieved Aug. 15, 2023, 3 pages.

"Crystal", https://en.wikipedia.org/wiki/Crystal, retrieved Aug. 15, 2023, 11 pages.

"Crystal Growth", https://en.wikipedia.org/wiki/Crystal_growth, retrieved Aug. 15, 2023, 6 pages.

Czochralski Method, https://en.wikipedia.org/wiki/Czochralski_method, retrieved Aug. 15, 2023, 6 pages.

* cited by examiner

CRYSTALLINE WAFERS AND PROCESS FOR FORMING CRYSTALLINE WAFERS

BACKGROUND

Single crystal diamond wafers may be grown using chemical vapor deposition (CVD) processes. Such processes may successfully grow relatively thick (e.g., 10 mm) wafers. However, conventional slicing techniques such as sawing, laser sawing, and/or etching prove to problematic. For example, conventional slicing techniques may incur a large amount of cutting loss. Conventional etching techniques may be too time consuming (e.g., etch periods on the order of days) to be economically viable.

BRIEF SUMMARY OF THE DISCLOSURE

Shown in and/or described in connection with at least one of the figures, and set forth more completely in the claims are processes that include, among other things, creating a damaged layer beneath an upper surface of a seed wafer, annealing the damaged layer to form a graphitized interface beneath the upper surface of the seed wafer, and laser-splitting the seed wafer along the graphitized interface to separate a diamond film or diamond wafer from the seed wafer. Such techniques may provide less cutting loss, may be more time efficient, and/or may possess other advantages over conventional techniques.

These and other advantages, aspects and novel features of the present disclosure, as well as details of illustrated embodiments thereof, will be more fully understood from the following description and drawings.

BRIEF DESCRIPTION OF THE DRAWINGS

Various features and advantages of the present disclosure may be more readily understood with reference to the following detailed description taken in conjunction with the accompanying drawings, wherein like reference numerals designate like structural elements.

DESCRIPTION

Figure 1:
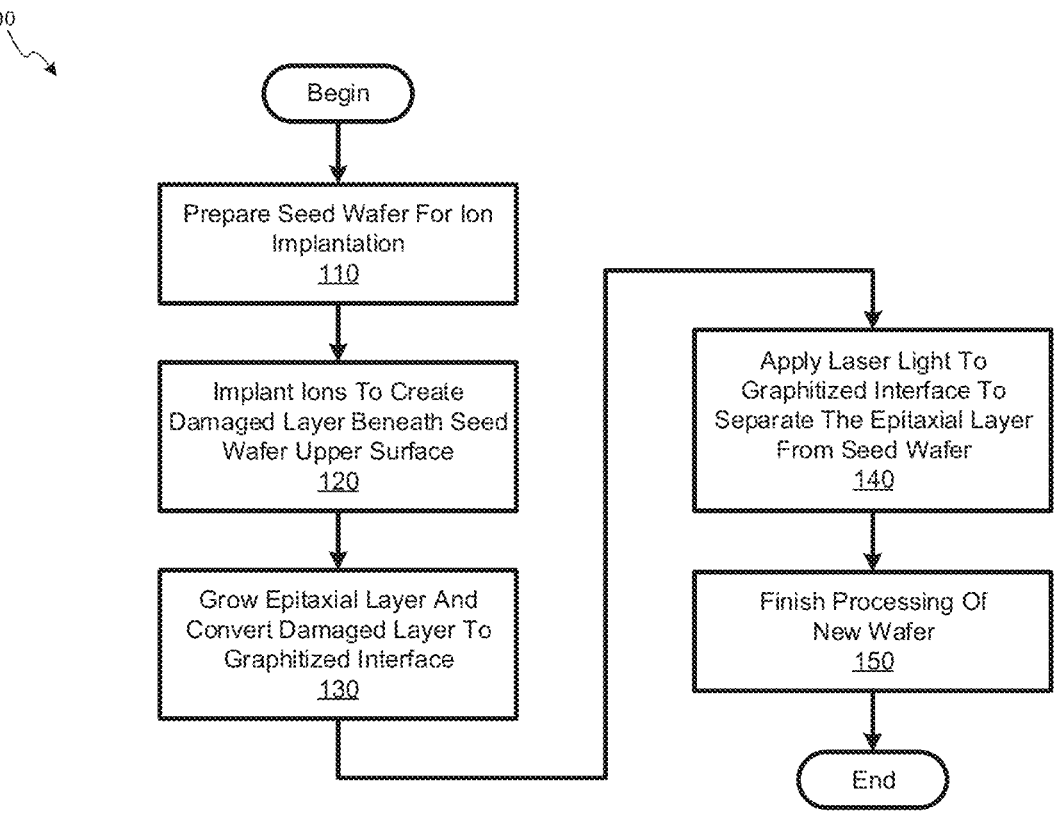
FIG. 1 depicts a flowchart of a process of forming diamond wafers or films from a seed wafer in accordance with various aspects of the present disclosure.

The following discussion provides various examples of providing diamond wafers or films. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

Generally, aspects of the present disclosure are directed to processes for forming crystalline wafers or films. Such a process may include creating a damaged layer in a seed wafer at a depth from a seed wafer upper surface and forming a crystalline structure on the seed wafer upper surface. The method may also include applying light from a laser to the damaged layer to separate the formed crystalline structure from the seed wafer and obtain the wafer. More specifically, the seed wafer may include a diamond crystalline structure. The forming of the crystalline structure may include growing a diamond epitaxial layer on the seed wafer upper surface via a chemical vapor deposition (CVD) process. A growth temperature of the CVD process may convert the damaged layer into a graphitized interface between the seed wafer and the diamond epitaxial layer. Applying the light from the laser may separate the diamond epitaxial layer from the seed wafer to obtain a diamond wafer.

Figure 2:
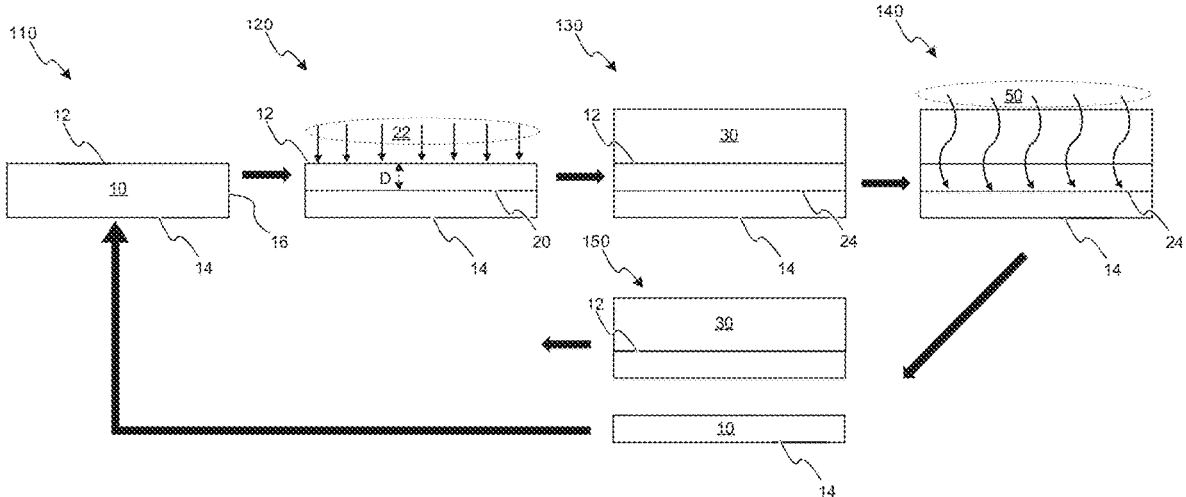
FIG. 2 provides cross-sectional views of the seed wafer at various stages of the FIG. 1 process.
Figure 3:
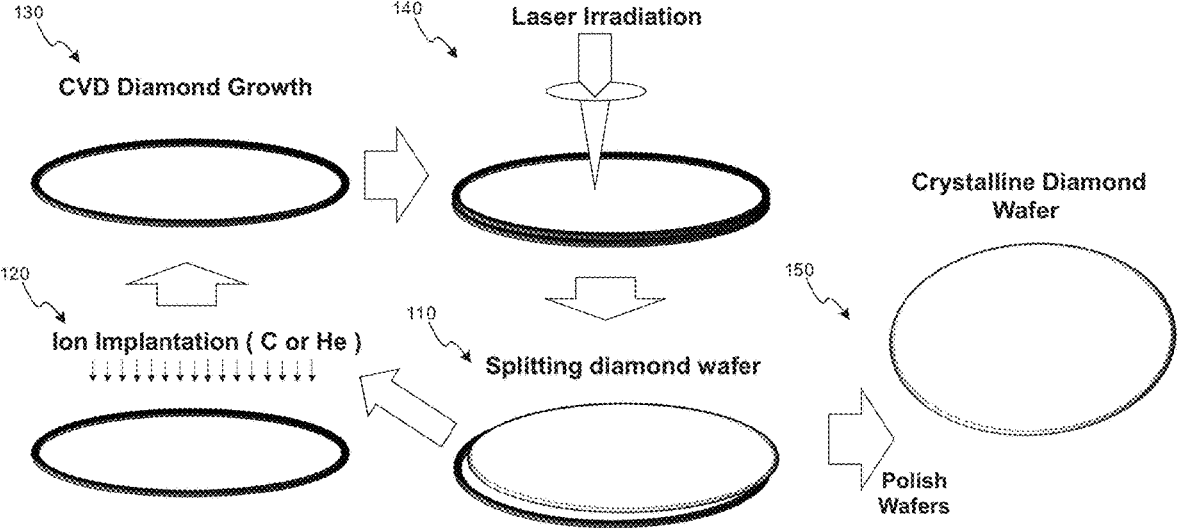
FIG. 3 provides perspective views of the seed wafer at various stages of the FIG. 1 process.

Referring now to FIGS. 1-3, a process 100 of forming diamond wafers or films is shown. While the process 100 is shown and described below specifically in regard to forming diamond wafers or films, the process 100 may be used to form wafers or films of crystalline materials other than diamond. At 110, a seed wafer 10 is prepared for ion implantation. The seed wafer 10 may comprise a seed wafer upper surface 12, a seed wafer lower surface 14, and a seed wafer lateral surface 16 between the seed wafer upper surface 12 and the seed wafer lower surface 14. At 110, the seed wafer upper surface 12 may be polished to remove surface defects in the diamond crystalline structure of the seed wafer 10.

At 120, a damaged layer 20 may be created below the seed wafer upper surface 12. To this end, ions 22 may be implanted to a desired depth D in the seed wafer 10 via the seed wafer upper surface 12. Such implanting may damage the diamond crystalline structure and creating bond vacancies in the diamond crystalline structure of the seed wafer 10. Various ionic species may be implanted. In particular, hydrogen, helium, and/or carbon ions may be implanted via the seed wafer upper surface 12 to a depth below the seed wafer upper surface 12 that is dependent upon the ionic species and the implantation energy.

Figure 4:
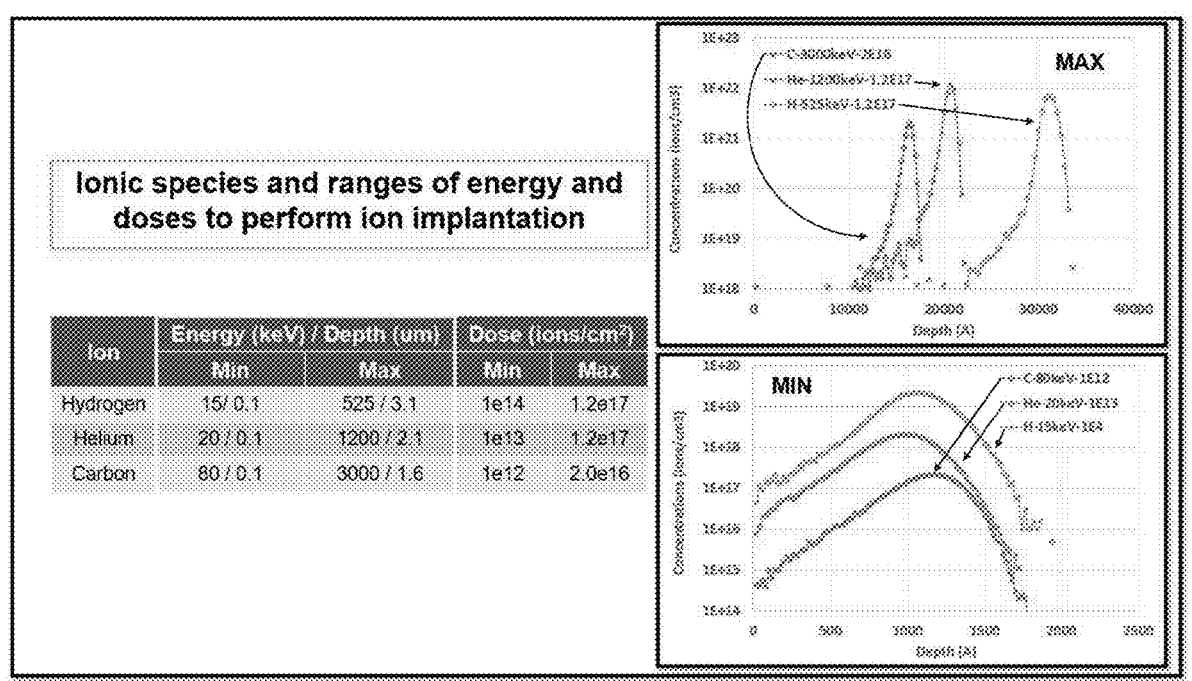
FIG. 4 depicts ionic species and respective energy ranges, dosage ranges, and depths at the depicted maximum and minimum dosages.

As shown in the table of FIG. 4, hydrogen ions may be implanted using an implant energy ranging from 20 kilo-electronvolts (keV) to 525 keV, which respectively correspond to a peak concentration implantation depth between 0.1 microns ($\mu$m) and 3.0 $\mu$m into the diamond crystalline structure of the seed wafer 10. Similarly, helium ions may be implanted using an implant energy ranging from 20 keV to 1220 keV, which respectively correspond to a peak concentration implantation depth of between 0.2 $\mu$m and 2.0 $\mu$m into the diamond crystalline structure of the seed wafer 10. Further, carbon ions may be implanted using an implant energy ranging from 80 keV to 1220 keV, which respectively correspond to a peak concentration implantation depth of between 0.1 $\mu$m and 1.6 $\mu$m into the diamond crystalline structure of the seed wafer 10.

FIG. 4 further provides a first graph of concentration versus depth of the hydrogen, helium, and carbon ion species at their respective maximum ion implantation energies and maximum dosages noted in the table. FIG. 4 further provides a second graph of concentration versus depth of the hydrogen, helium, and carbon ion species at their respective minimum ion implantation energies and minimum dosages noted in the table. The graphs are based on simulation data.

Figure 5:
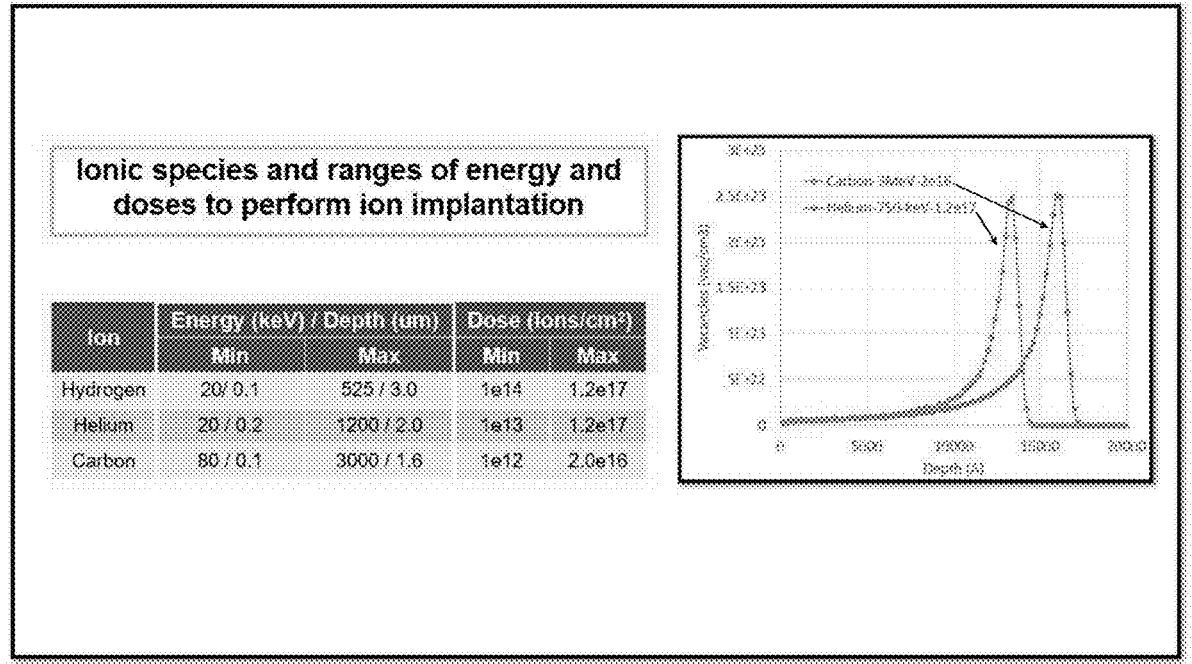
FIG. 5 depicts ionic species and respective energy ranges, dosage ranges, damage in vacancies at the depicted maximum dosages.

As further shown in FIG. 5, the concentration of vacant bonds at the implantation depth is dependent upon the implantation dosage of the various ion species. In particular, hydrogen ions may be implanted at a dosage ranging between 1e14 ions/cm$^2$ to 1.2e17 ions/cm$^2$. Helium ions may be implanted at a dosage ranging between 1e13 ions/cm$^2$ to 1.2e17. Carbon ions may be implanted at a dosage ranging between 1e12 and 2.0e16. The graph of FIG. 5 depicts vacancies versus implantation depth for carbon ions and helium ions at their respective listed maximum implantation energies and dosages. As shown, implantation energies and dosages may result in peak vacancies of roughly 2.5e23 per cubic centimeter. Again, the graph is based on simulation data.

At 130, the process 100 grows an epitaxial layer 30 on the seed wafer 10. To this end, the process 100 may use a crystal growth process suitable for growing an epitaxial layer 30 of diamond on the seed wafer upper surface 12. Such growth may result in the formation of grains whose crystalline structure aligns with the crystalline structure of seed wafer 10 and continues such crystalline structure beyond the seed wafer upper surface 12.

In various embodiments, a chemical vapor deposition (CVD) process may be used to grow the epitaxial layer 30. Such a CVD process may be conducted at growth temperatures (e.g., 1100-1150° C.) that are sufficient to anneal the damaged layer 20 and convert the damaged layer 20 into graphite. Such conversion to graphite effectively provides a graphitized interface 24 between the diamond crystalline structure of the seed wafer 10 and the diamond crystalline structure of the epitaxial layer 30.

After forming the epitaxial layer 30 and forming the graphitized interface 24, the process 100 at 140 may separate the epitaxial layer 30 from the seed wafer 10. To this end, the process 100 may include focusing light emitted from a laser 50 on the graphitized interface 24 to break bonds of the graphitized interface 24 and separate the epitaxial layer 30 from the seed wafer 10. In various embodiments, the graphitized interface 24 provides an opaque layer in the otherwise transparent structure. Due to the opaque nature of the graphitized interface 24, the laser 50 may be absorbed by the graphitized interface 24 and break bonds of the graphitized interface 24. As such, the effects of the laser 50 may be localized to the graphitized interface 24 and thus avoid further damaging the crystalline structure of the epitaxial layer 30 and/or seed wafer 10.

At 150, the process 100 may output a new diamond wafer or film by finish processing of the separated epitaxial layer 30. In particular, the process 100 may polish and/or etch a lower side of the separated epitaxial layer 30 to remove remnants of the graphitized interface 24. Such polishing and/or etching may also remove and/or reduce defects along the graphitized interface 24.

As shown in FIGS. 2 and 3, the process 100 may be repeated and the seed wafer 10 may be reused.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A method of forming a wafer, the method comprising:
   creating a damaged layer in a diamond crystalline structure of a seed wafer at a depth from a seed wafer upper surface;
   forming a crystalline structure on the seed wafer upper surface; and
   applying light from a laser to the damaged layer to separate the formed crystalline structure from the seed wafer and obtain the wafer; and
   wherein forming the crystalline structure comprises using a chemical vapor deposition (CVD) process to grow an epitaxial layer, and
   wherein a growth temperature of the CVD process converts the damaged layer into graphite.

2. The method of claim 1, wherein creating the damaged layer comprises implanting ions into the seed wafer via the seed wafer upper surface.

3. The method of claim 1, wherein creating the damaged layer comprises implanting helium ions into the seed wafer via the seed wafer upper surface.

4. The method of claim 1, wherein creating the damaged layer comprises implanting hydrogen ions into the seed wafer via the seed wafer upper surface.

5. The method of claim 1, wherein creating the damaged layer comprises implanting carbon ions into the seed wafer via the seed wafer upper surface.

6. The method of claim 1, wherein forming the crystalline structure comprising growing an epitaxial layer on the seed wafer upper surface.

7. The method of claim 6, wherein growing the epitaxial layer comprises using a chemical vapor deposition (CVD) process to grow the epitaxial layer.

8. The method of claim 7, wherein a growth temperature of the CVD process anneals the damaged layer.

9. The method of claim 1, comprising removing remnants of the damaged layer from the wafer.

10. The method of claim 1, comprising polishing a lower surface of the wafer.

11. The method of claim 1, comprising etching a lower surface of the wafer.

12. The method of claim 1, comprising reusing the seed wafer, after separating the wafer from the seed wafer, to form another wafer.

13. The method of claim 1, wherein:

the seed wafer comprises a diamond crystalline structure; and the wafer separated from the seed wafer comprises a diamond crystalline structure.

14. A method of forming a diamond wafer, the method comprising:

creating a damaged layer in a seed wafer at a depth from a seed wafer upper surface, wherein the seed wafer comprises a diamond crystalline structure;

growing a diamond epitaxial layer on the seed wafer upper surface via a chemical vapor deposition (CVD)

process, wherein a growth temperature of the CVD process converts the damaged layer into a graphitized interface; and applying light from a laser to the graphitized interface to separate the diamond epitaxial layer from the seed wafer and obtain the diamond wafer.

15. The method of claim 14, wherein creating the damaged layer comprises implanting ions into the seed wafer via the seed wafer upper surface.

16. The method of claim 15, wherein the ions include helium, hydrogen, and/or carbon ions.

17. The method of claim 14, comprising removing remnants of the graphitized interface from the diamond wafer.

18. The method of claim 14, comprising polishing a lower surface of the diamond wafer.

19. The method of claim 14, comprising etching a lower surface of the diamond wafer.

* * * * *